(12) United States Patent
Matsuzuka et al.

(10) Patent No.: US 6,535,090 B1
(45) Date of Patent: Mar. 18, 2003

(54) COMPACT HIGH-FREQUENCY CIRCUIT DEVICE

(75) Inventors: Takayuki Matsuzuka, Tokyo (JP); Takayuki Katoh, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/714,287

(22) Filed: Nov. 17, 2000

(30) Foreign Application Priority Data

Jun. 7, 2000 (JP) ........................................ 2000-171331

(51) Int. Cl.$^7$ ................................................ H01P 3/08
(52) U.S. Cl. ........................ 333/246; 333/125; 333/26
(58) Field of Search ................................ 333/246, 124, 333/125, 26, 16

(56) References Cited

U.S. PATENT DOCUMENTS 5,532,643 A * 7/1996 Kuffner et al. ............. 333/116
5,872,545 A * 2/1999 Rammos ............... 343/700 MS

FOREIGN PATENT DOCUMENTS

| EP | 0903803 A2 | * | 3/1999 | ............ H01P/5/10 |
| JP | 8-250911 | | 9/1996 | |
| JP | 8-250913 | | 9/1996 | |
| JP | 9-237867 | | 9/1997 | |
| JP | 11-163185 | | 6/1999 | |

* cited by examiner

Primary Examiner—Robert Pascal
Assistant Examiner—Kimberly E Glenn
(74) Attorney, Agent, or Firm—Leydig, Voit & Mayer, Ltd.

(57) ABSTRACT

A compact high-frequency circuit device including a signal distribution circuit and a signal combining circuit. The high-frequency circuit device has a multilayer circuit, and the multilayer circuit includes a first conductor for transmitting a signal; a first dielectric layer in which the first conductor is embedded; a first ground conductor layer on one surface of the first dielectric layer and having a first opening; a second ground conductor layer on the other surface of the first dielectric layer and having another first opening, the first openings of the first and second ground conductor layers being mutually opposed; second dielectric layers, one being provided on the surface of the first ground conductor layer, and the other on the surface of the second ground conductors layer; and a pair of second conductors for transferring a signal, one being provided on the surface of one of the dielectric layers and the other on the surface of the other second dielectric layer, portions of the second conductors being mutually opposed at the first openings.

18 Claims, 11 Drawing Sheets

COMPACT HIGH-FREQUENCY CIRCUIT DEVICE

BACKGROUND OF THE INVENTION

1. Field of the Invention

The present invention relates to a compact high-frequency circuit device that operates in a high frequency range, particularly, in an extremely high frequency (EHF) range of 30 GHz or more.

2. Description of the Related Art

FIG. 18 is a plan view showing a conventional high-frequency semiconductor package.

In FIG. 18, reference numeral 200 designates a semiconductor package; 201 designates a package housing; 202 designates a semiconductor chip typified by a monolithic microwave IC (MMIC); 203 designates a cavity in which the semiconductor chip 202 is to be mounted; 204 designates a bonding wire; 205 designates a microstrip line; 206 designates a cavity wall; and 207 designates a feedthrough. The feedthrough 207 comprises a microstrip line 207a, a strip line 207b, and a microstrip line 207c, which penetrate through the cavity wall 206.

Reference numeral 208 designates an isolation resistor; reference numeral 209 designates a signal distribution circuit; and reference numeral 210 designates a signal composition circuit.

FIG. 19 is a perspective view showing the package housing 201 of the conventional high-frequency circuit device shorten in FIG. 1. After the semiconductor chips 202 have been mounted on the package housing 201, the package housing 201 is encapsulated with a cover (not shown).

Here, the expression "semiconductor package" used herein generally designates a package formed by means of encapsulating a single-function MMIC chip in a package housing.

In the conventional high-frequency semiconductor package 200, for example, two semiconductor chips are arranged in a side-by-side configuration. In this configuration, a plurality of semiconductor chips 202, the signal distribution circuit 209, and the signal composition circuit 210 are disposed in a common plane. The signal distribution circuit 209 and the signal composition circuit 210 usually require lines having lengths which are about one-quarter the wavelength of the frequency employed by the high-frequency semiconductor package 200. For this reason, the in-plane area of the cavity 203 cannot be made sufficiently small, which imposes difficulty in miniaturizing the high-frequency semiconductor package 200.

Further, the in-plane area of the cavity 203 becomes prone to increase, thereby facilitating occurrence of spatial resonance attributable to cavity size.

Further, in a case where two semiconductor chips, for example, are disposed in a side-by-side configuration, the degree of isolation between the semiconductor chips 202 is generally low. For this reason, there may often arise leakage of a signal. A ground conductor layer having openings is interposed between dielectric layers, and a signal is transmitted through one of the openings. Similar configurations are described in, for example, Japanese Patent Laid-Open Nos. Hei. 11-163185, Hei. 9-237867, Hei. 8-250913, Hei. 8-250911, Hei. 10-303616, Hei. 195732, Hei. 10-270586 and Hei. 10-176113. These configurations are only for transferring by means of electromagnetic coupling via an opening.

These configurations correspond to a one input/one output circuit and are merely intended to transmit a signal between layers.

SUMMARY OF THE INVENTION

The present invention has been conceived to solve such a problem of a conventional high-frequency semiconductor package as mentioned above, and is aimed at providing a compact high-frequency circuit device comprising a distribution circuit and a composition circuit. Further, the present invention is aimed at providing a compact high-frequency circuit device that achieves a superior electric characteristic even when a plurality of semiconductor chip is packaged.

According to one aspect of the present invention, the foregoing and other objects are attained by providing a high-frequency circuit device having a multi-layer circuit as follows. The multi-layer circuit comprises: a first conductor for transmitting a signal; a first dielectric layer inserting the first conductor; a first ground conductor layer which is provided on one surface of the first dielectric layer and has a first opening; a second ground conductor layer which is provided on the other surface of the first dielectric layer and has another first opening, the openings of the first and second ground conductor layers being mutually opposed by way of the first dielectric layer; second dielectric layers, one being provided on the surface of the first ground conductor layer and the other being provided on the surface of the second ground conductor layer; and a pair of second conductors for transferring a signal, one being provided on the surface of one of the second dielectric layer and the other being provided on the surface of the other of the second dielectric layer, portions of the second conductors being mutually opposed via the first openings.

Accordingly, a signal distribution circuit and a signal composition circuit are formed into a multi-layer structure. Thus, the signal distribution circuit and the signal composition circuit can be made compact. As a result, there can be embodied a compact high-frequency circuit device.

In accordance with another aspect of the present invention, the foregoing and other objects are attained by providing a high-frequency circuit device comprising an input multilayer circuit, an output multilayer circuit and semiconductor elements as follows. The input multi-layer circuit including; a first conductor for transmitting an input signal, a first dielectric layer inserting the first conductor, a first ground conductor layer which is provided on one surface of the first dielectric layer and has an input opening, a second ground conductor layer which is provided on the other surface of the first dielectric layer and has another input opening, the input openings of the first and second ground conductor layers being mutually opposed through the first dielectric layer, second dielectric layers which are respectively provided on the surfaces of the first and second conductor layers so as to expose portions thereof, and a pair of second conductors for transmitting an input signal which are provided on the surfaces of the respective second dielectric layers, portions of the second conductors covering portions of the first conductor, and the second conductors being mutually opposed by way of the input openings. The output multi-layer circuit including; a third conductor for transmitting an output signal, the first dielectric layer inserting the third conductor, the first ground conductor layer which is provided on one surface of the first dielectric layer and has an output opening, the second ground conductor layer which is provided on the other surface of the first dielectric layer and has another output opening, the output openings of the first and second ground conductor layers being mutually opposed through the first dielectric layer, the second dielectric layers which are respectively provided on the surfaces of the first and second conductor layers, and a pair of fourth conductors for transmitting an output signal which are provided on the surfaces of the respective second dielectric layers, portions of the fourth conductors covering portions of the third conductor, and the fourth conductors being mutually opposed by way of the output openings. The semiconductor elements are provided in respective exposed portions formed in the first and second ground conductor layers, one semiconductor element being connected to the second conductor and the fourth conductor on one side, and the other semiconductor element being connected to the second conductor and the fourth conductor on the other side.

Accordingly, there can be embodied a compact high-frequency circuit device having a plurality of semiconductor elements, and distribution/composition circuits.

Other objects and advantages of the invention will become apparent from the detailed description given hereinafter. It should be understood, however, that the detailed description and specific embodiments are given by way of illustration only since various changes and modifications within the scope of the invention will become apparent to those skilled in the art from this detailed description.

BRIEF DESCRIPTION OF THE DRAWINGS

In all figures, the substantially same elements are given the same reference numbers.

DETAILED DESCRIPTION OF THE PREFERRED EMBODIMENTS

First Embodiment

A first embodiment of the present invention is directed toward a compact signal distribution circuit in which a one-input transmission line and a two-output transmission line are stacked into layers, the circuit being intended to distribute an input signal through openings by means of electromagnetic coupling.

Figure 1:
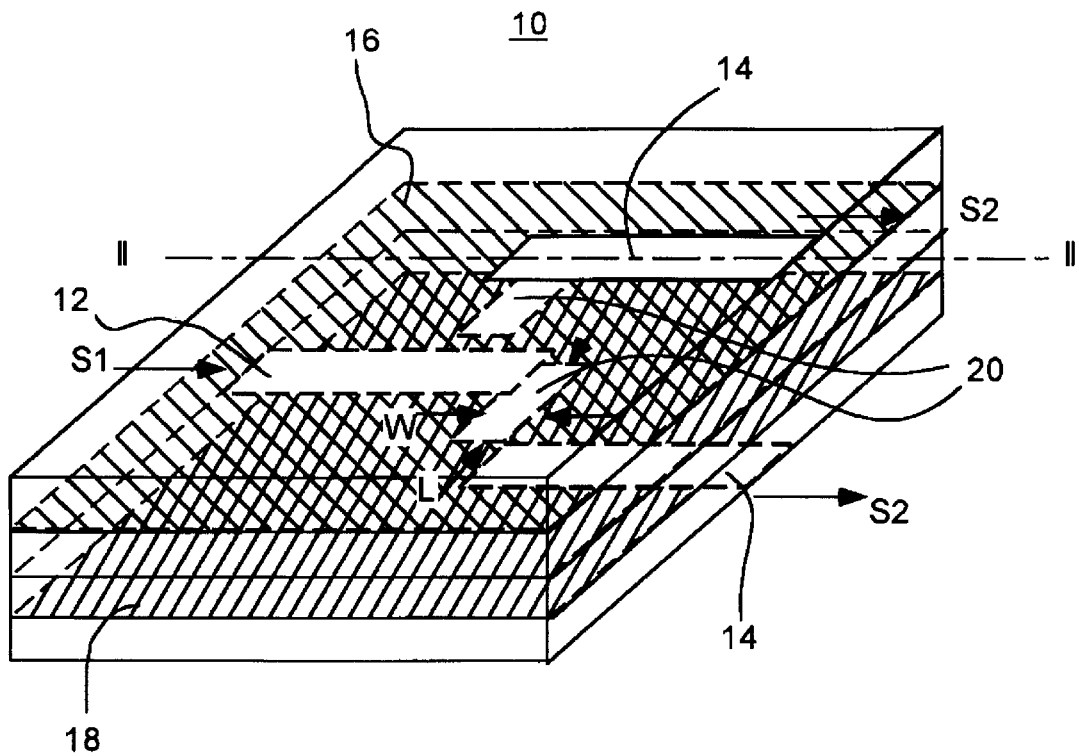
FIG. 1 is a partial perspective view showing a multi-layer circuit of a high-frequency circuit device according to a first embodiment of the present invention.
Figure 2:
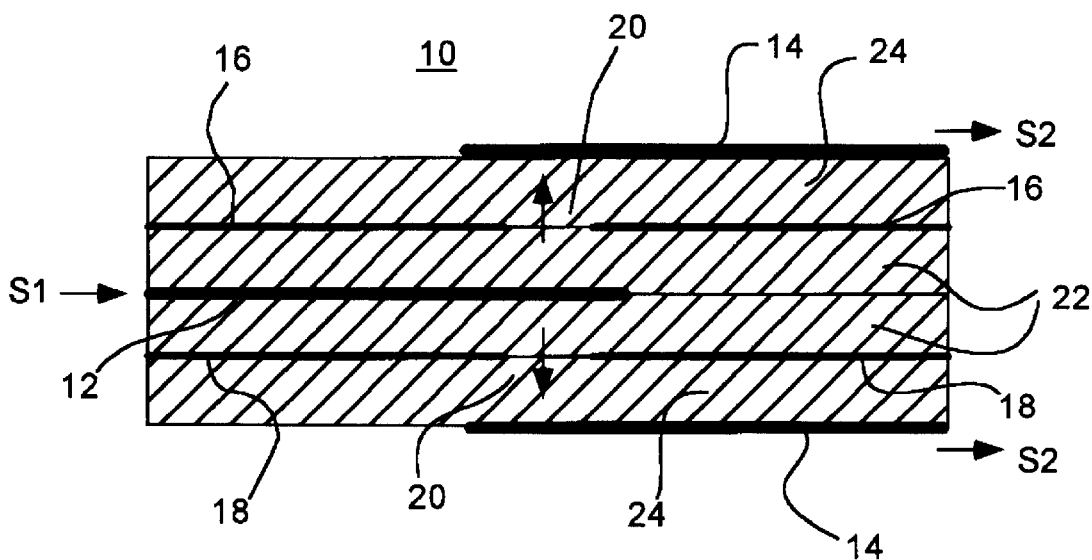
FIG. 2 is a cross-sectional view taken along line II—II shown in FIG. 1.

FIG. 1 is a partial perspective view showing a multilayer circuit of a high-frequency circuit device according to a first embodiment of the present invention. FIG. 2 is a cross-sectional view taken along line II—II shown in FIG. 1.

In FIG. 1, reference numeral 10 designates a signal distribution circuit, which serves as a multilayer circuit constituting a portion of the high-frequency circuit device. The signal distribution circuit is connected to a semiconductor element (not shown) and various circuit elements (not shown).

Reference numeral 12 designates an input signal line serving as a first conductor; 14 designates a pair of output signal lines serving as second conductors; 16 designates a first ground conductor layer; and 18 designates a second ground conductor layer. Each of the first ground conductor layer 16 and the second ground conductor layer 18 has a distribution slot 20 serving as a first opening.

The width of the distribution slot 20; that is, the length of a shorter side that extends parallel to the input signal line 12 and the output signal line 14, is taken as W. Further, the length of the distribution slot 20; that is, the length of the longer side that extends in a direction perpendicular to the input signal line 12 and the output signal line 14, is taken as L.

As shown in FIG. 2, the input signal line 12 assumes the shape of a strip and is sandwiched between first dielectric layers 22. The first ground conductor layer 16 is laid over substantially the entire top surface of the upper first dielectric layer 22, and the second ground conductor layer 18 is laid over substantially the entire underside of the lower first dielectric layer 22. Further, a second dielectric layer 24 is laid over the first ground conductor layer 16, and another second dielectric layer 24 is laid under the second ground conductor layer 18. One of the output signal line pair 14 is formed in the shape of a strip on the surface of one of the second dielectric layers 24, and the remaining output signal line 14 is formed in the shape of a strip on the surface of the other second dielectric layer 24. The output signal lines 14 are disposed opposite each other by way of the distribution slots 20.

The input signal line 12 and the output signal lines 14 are disposed so as to partially overlap by way of the distribution slots 20, thereby effecting efficient electromagnetic coupling between the input signal line 12 and the output signal lines 14. Arrows provided in the distribution slots 20 designate directions in which signals are transmitted.

The first dielectric layers 22 and the second dielectric layer 24 are usually formed from alumina ceramic ($Al_2O_3$), but may be formed from AlN or glass ceramic. Respective first dielectric layers 22 and the respective second dielectric layers 24 have a thickness of 200 μm. The thickness may vary in accordance with a frequency band used by the signal distribution circuit 10. In many cases, the first and second dielectric layers 22 and 24 assume substantially the same thickness as that of a board used for packaging the signal distributions circuit 10.

The input signal line 12 is formed from metal; for example, Au, Cu, Ni, or W, on the surface of one dielectric layer 22, by means of printing, plating, or sputtering. Another first dielectric layer 22 is formed on the surface of the one dielectric layer 22, wherewith the input signal line 12 is sandwiched between the two first dielectric layers 22. Similarly, the output signal line 14 is formed from metal; for example, Au, Cu, Ni, or W, on the surface of the second dielectric layer 24, by means of printing, plating, or sputtering.

The width of the input signal line 12 and that of the output signal line 14 may vary in accordance with a frequency band, the dielectric constant of the first dielectric layer 22, or the dielectric constant of the second dielectric layer 24. However, the input signal line 12 and the output signal line 14 are of substantially the same widths as the thickness of the first and second dielectric layers 22 and 24.

The first ground conductor layer 16 and the second ground conductor layer 18 are formed from metal; for example, Au, Cu, Ni, or W, on the entire surface of the first dielectric layer 22 or the entire surface of the second dielectric layer 24, with the except of an area for the distribution slot 20, by means of printing, plating, or sputtering.

The distribution slot 20 may vary in accordance with a frequency band. In the present embodiment, the distribution slot 20 has a width W of 200 μm and a length L of 600 μm.

In a case where electromagnetic coupling conversion is effected between a single input signal line 12 and a single output signal line 14 simply by way of the distribution slot 20, the distribution slot 20 assumes substantially the same width as does the input signal line 12 or the output signal line 14, and a length which is substantially three times the width of the input signal line 12 or that of the output signal line 14. Thus, impedance matching is ensured between the electromagnetic coupling conversion area and the input signal line 12 or the output signal line 14.

However, in a case where electromagnetic coupling conversion is effected between a single input signal line 12 and two output signal lines 14 by way of the distribution slot 20, as in the case of the present embodiment, and the distribution slot 20 has a width of 200 μm and a length of 600 μm, as mentioned above, impedance mismatching may arise between the electromagnetic coupling conversion area, and the input signal line 12 or the output signal line 14. For this reason, the width W of the distribution slot 20 is set to less than 100% of the width of the input signal line 12 or that of the output signal line 14. Further, the length L of the distribution 20 is set to less than 300% of the width of the input signal line 12 or that of the output signal line 14. More preferably, the width W of the distribution slot 20 is 80% or less the width of the input signal line 12 or that of the output signal line 14. Further, the length L of the distribution slot 20 is 250% or less the width of the input signal line 12 or that of the output signal line 14.

In the signal distribution circuit 10 having the foregoing construction, an input signal S1 is transmitted to the input signal line 12 from the outside. The input signal S1 is converted by means of electromagnetic coupling by way of the distribution slots 20, and output signals S2 are output from the respective output signal lines 14.

If a signal distribution circuit is constituted in the shape of a multilayer structure and distributes a signal three-dimensionally, there can be embodied a very compact signal distribution circuit whose in-plane area is comparatively small.

For instance, a Wilkinson signal distribution circuit requires a line length of about $\lambda/4$ to $\lambda/2$ (where $\lambda$ is a wavelength of a frequency used by the signal distribution circuit). In contrast, the signal distribution circuit 10 according to the present embodiment can be constructed through use of a line having a length of $\lambda/10$ to $\lambda/8$.

In a case where the Wilkinson signal distribution circuit is compared with the signal distribution circuit 10, both being for use at a frequency of 30 GHz, the Wilkinson signal distribution circuit requires a line length of about 5 mm, and the signal distribution circuit 10 according to the embodiment requires a line length of about 1 mm.

As mentioned above, the signal distribution circuit 10 has a multilayer structure and distributes a signal three-dimensionally, and hence the in-plane area of the signal distribution circuit 10 is reduced. As a result, a very compact signal distribution circuit is embodied, and, by extension, there can be constituted a compact high-frequency circuit device using the signal distribution circuit 10.

Second Embodiment

The present embodiment relates to a compact signal composition circuit in which two input transmission lines and one output transmission line are stacked into layers. Input signals are merged into a single output signal by means of electromagnetic coupling.

Figure 3:
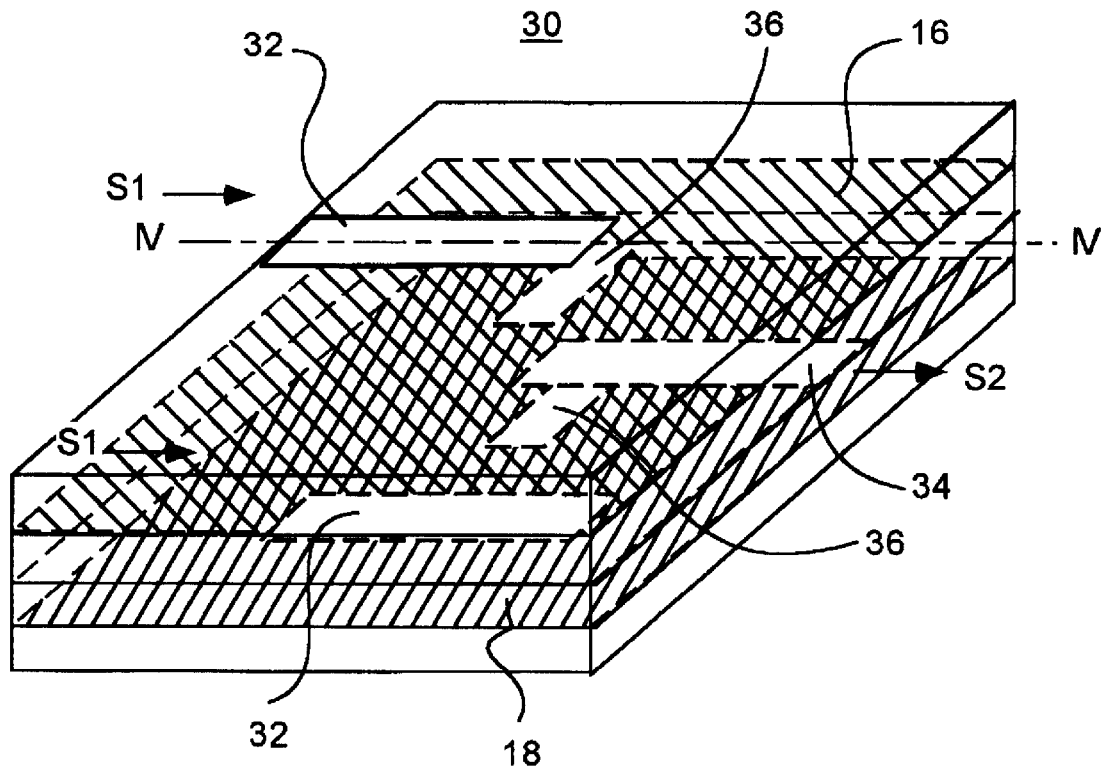
FIG. 3 is a perspective view showing a multi-layer circuit of a high-frequency circuit device according to a second embodiment of the present invention.
Figure 4:
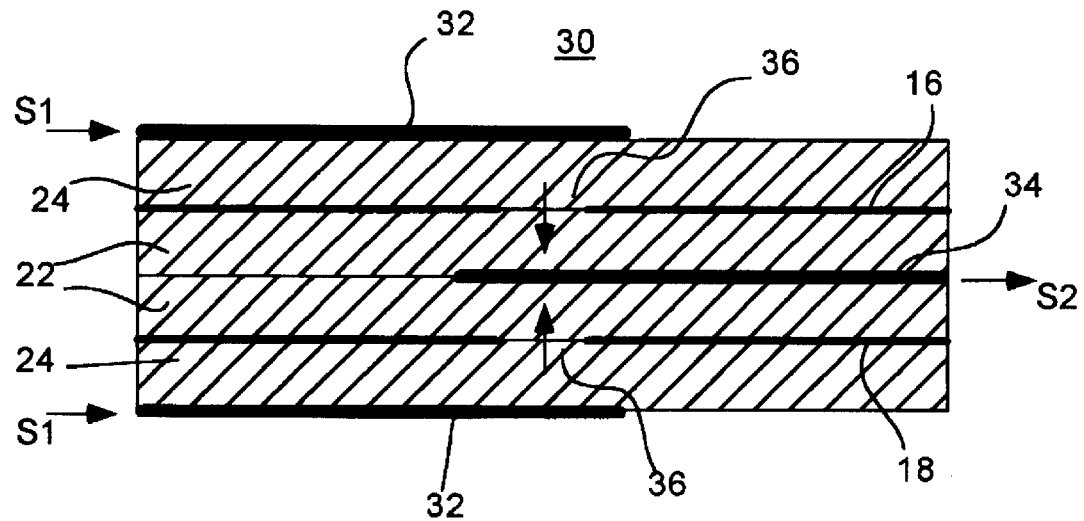
FIG. 4 is a cross-sectional view taken along line IV—IV shown in FIG. 3.

FIG. 3 is a perspective view showing a multilayer circuit of a high-frequency circuit device according to a second embodiment of the present invention. FIG. 4 is a cross-sectional view taken along line IV—IV shown in FIG. 3.

In FIG. 3, reference numeral 30 designates a signal composition circuit, which serves as a multilayer circuit constituting a portion of a high-frequency circuit device. The signal composition circuit 30 is connected to a semiconductor element (not shown) or any of various circuit elements (not shown).

Reference numeral 32 designates a pair of input signal lines serving as second conductors; 34 designates an output signal line serving as a first conductor; 16 designates a first ground conductor layer; and 18 designates a second ground conductor layer. A composition slot 36 serving as a first opening is formed in each of the first ground layer conductor layer 16 and the second ground conductor layer 18.

As shown in FIGS. 3 and 4, the output signal line 34 is sandwiched between the first dielectric layers 22. One of a pair of input signal lines 32 is laid on the surface of one of the second dielectric layer 24, and the remaining input signal line 32 is laid on the surface of another second dielectric layer 24. In other respects, the high-frequency circuit device according to the present invention is identical with that described in connection with the first embodiment.

A pair of input signals S1 is transmitted to the respective input signal lines 32 from the outside and is merged into a single signal through electromagnetic coupling via the composition slots 36. The resultant signal is transmitted to the output signal line 34, from which the signal is output to the outside as an output signal S2.

As mentioned above, the signal composition circuit 30 according to the present embodiment merges signals into a single signal three-dimensionally through use of a multilayer structure. Therefore, a very compact signal composition circuit requiring a small in-plane area is embodied, and, by extension, there can be realized a very compact high-frequency circuit device using such a signal composition circuit.

Third Embodiment

The present embodiment relates to a signal distribution circuit in which one input transmission line and two output transmission lines are stacked into layers and a signal is distributed through electromagnetic coupling by way of openings. The two output transmission lines are interconnected through use of a resistor, thereby constituting an isolation resistor.

Figure 5:
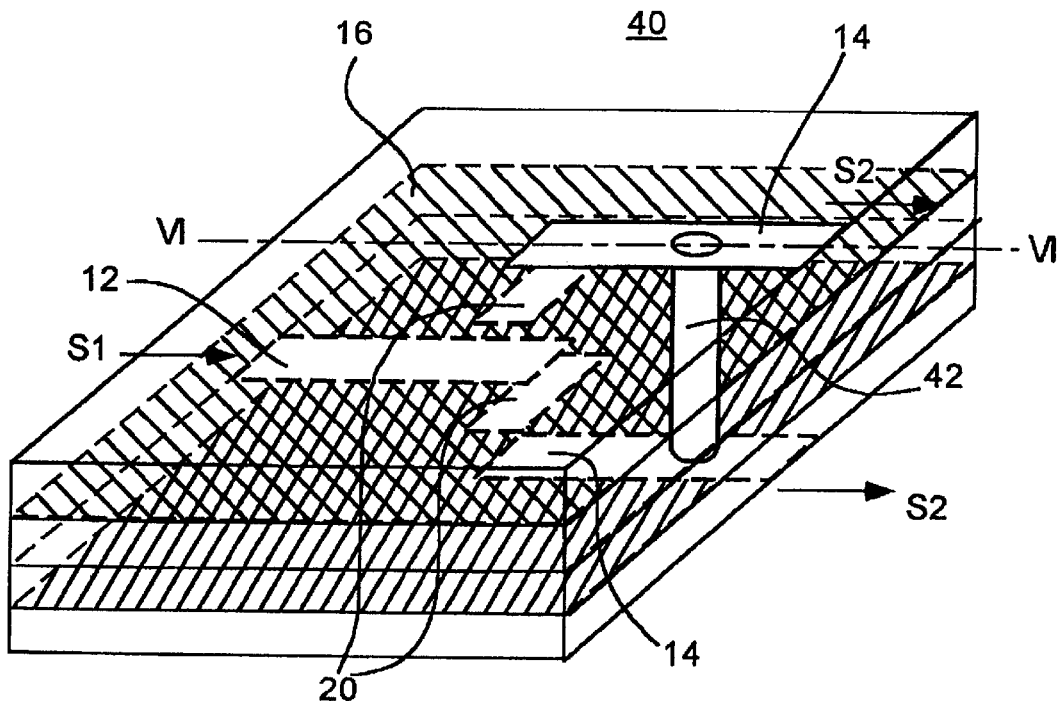
FIG. 5 is a perspective view showing a multi-layer circuit of a high-frequency circuit device according to a third embodiment of the present invention.
Figure 6:
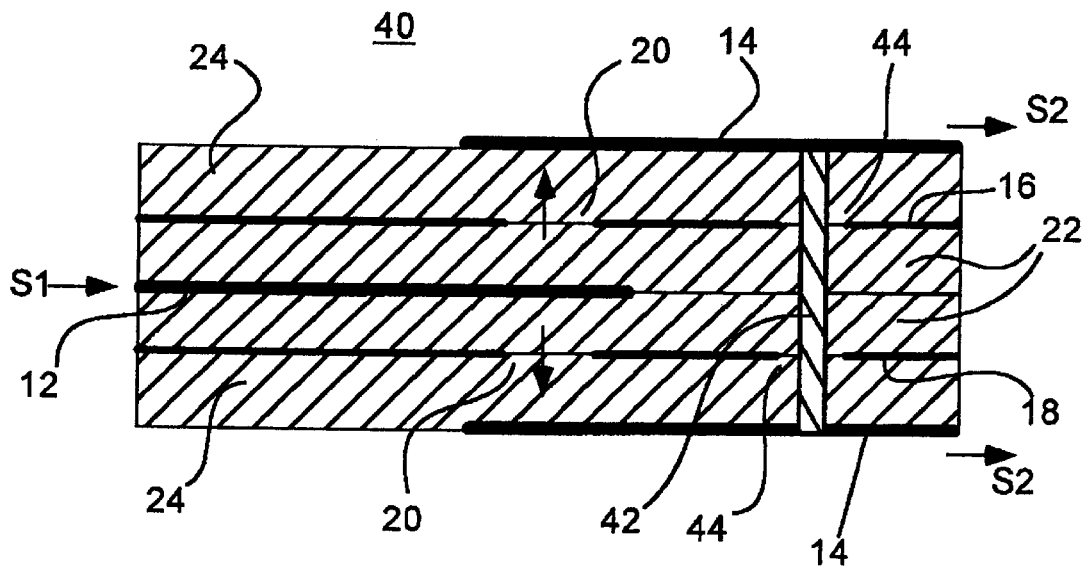
FIG. 6 is a cross-sectional view taken along line VI—VI shown in FIG. 5.

FIG. 5 is a perspective view showing a multilayer circuit of a high-frequency circuit device according to a third embodiment of the present invention. FIG. 6 is a cross-sectional view taken along line VI—VI shown in FIG. 5.

In FIG. 5, reference numeral 40 designates a signal distribution circuit, which serves as a multilayer circuit constituting a portion of the high-frequency circuit device. The signal distribution circuit 40 is connected to a semiconductor element (not shown) or any of various circuit elements (not shown).

Reference numeral 42 designates an isolation resistor serving as a resistor, and 44 designates slots which serve as second openings and are formed in the first and second ground conductor layers 16 and 18, the isolation resistor 42 being inserted through the slots 44.

In FIGS. 5 and 6, those reference numerals that are the same as those shown in FIGS. 1 and 2 designate the same or corresponding elements.

In the present embodiment, a through hole is vertically formed so as to interconnect the output signal lines 14 by passing through the first dielectric layers 22, the second dielectric layers 24, and the slots 44. Further, high fusing-point metal; for example, tungsten, is provided in the through hole, to thereby constitute the isolation resistor 42. The resistance of the resistor is usually equivalent to the characteristic impedance of a signal line. In many cases, the resistance assumes a value of 50Ω.

The isolation resistor 42 can establish impedance matching between the output signal lines 14 of the signal distribution circuit 40 and ensure isolation between the output signal lines 14.

The present embodiment illustrates a signal distribution circuit analogous to that described in connection with the first embodiment. In a case where the isolation resistor 42 is provided in the signal composition circuit described in the second embodiment, there is yielded the same advantage as that yielded in the present embodiment.

Fourth Embodiment

The present embodiment relates to a signal distribution circuit in which one input transmission line and two output transmission lines are stacked into layers and a signal is distributed through electromagnetic coupling via openings. Interconnection conductors are provided between a first ground conductor layer 16 and a second ground conductor layer 18, to thereby eliminate a potential difference between the ground conductors 16 and 18.

Figure 7:
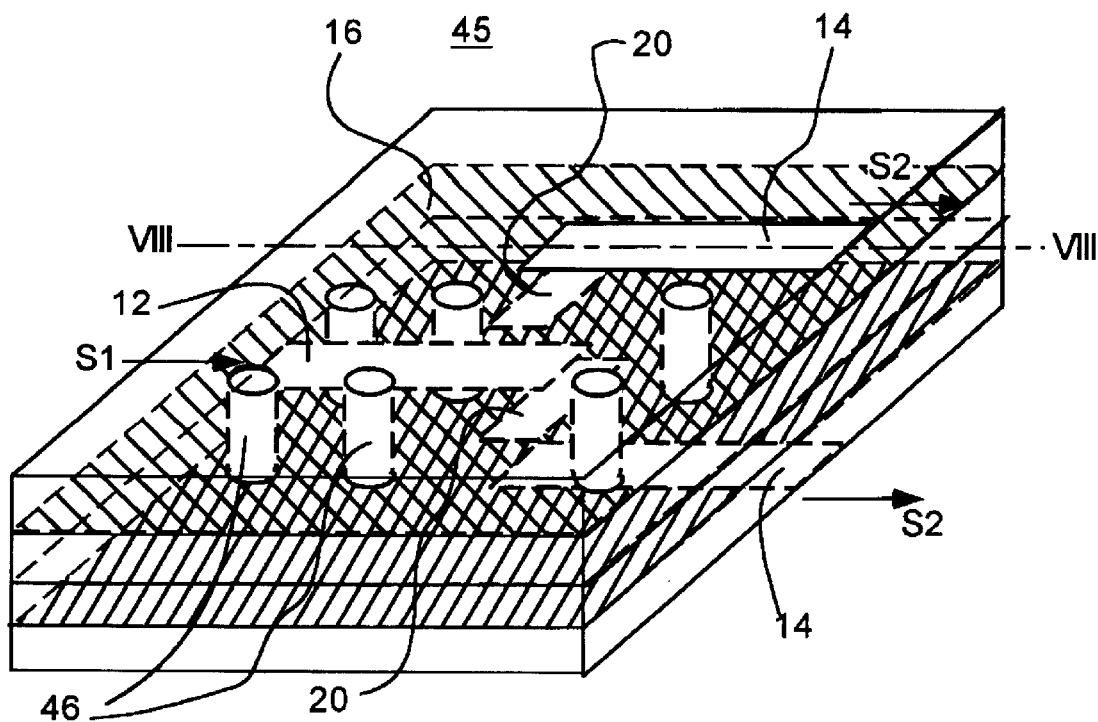
FIG. 7 is a perspective view showing a multi-layer circuit of a high-frequency circuit device according to a fourth embodiment of the present invention.
Figure 8:
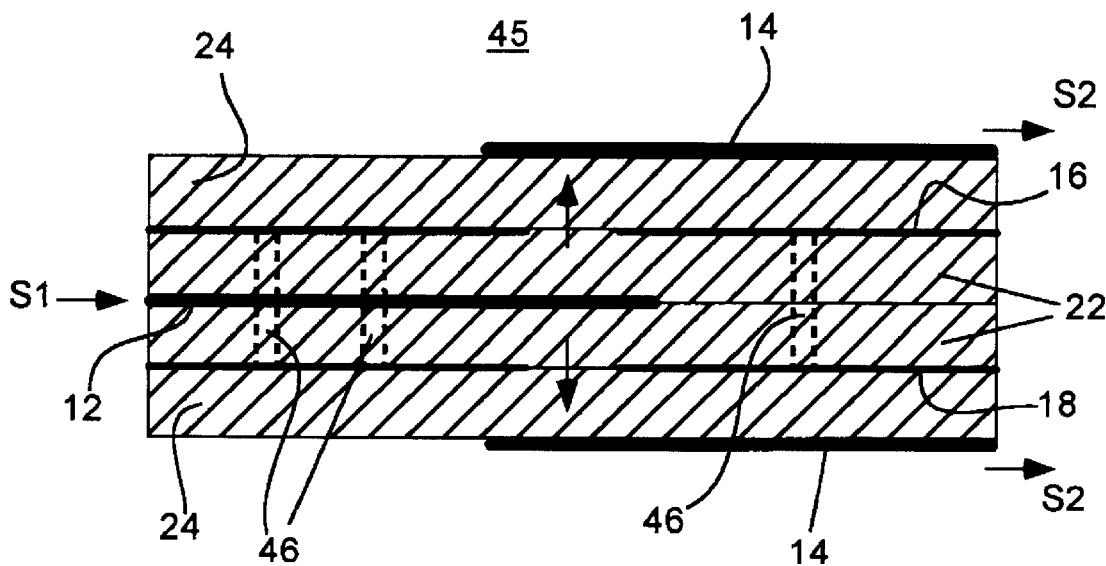
FIG. 8 is a cross-sectional view taken along line VIII—VIII shown in FIG. 7.

FIG. 7 is a perspective view showing a multilayer circuit of a high-frequency circuit device according to a fourth embodiment of the present invention. FIG. 8 is a cross-sectional view taken along line VIII—VIII shown in FIG. 7.

In FIG. 7, reference numeral 45 designates a signal distribution circuit, which serves as a multilayer circuit constituting a portion of the high-frequency circuit device. The signal distribution circuit is connected to a semiconductor element (not shown) or any of various circuit elements (not shown). Reference numeral 46 designates a through hole that serves as an interconnection conductor and is provided between the first ground conductor layer 16 and the second ground conductor layer 18.

In FIGS. 7 and 8, those reference numerals that are the same as those shown in FIGS. 1 and 2 designate the same or corresponding elements.

In a case where a plurality of ground conductor layers is formed in a device, a potential difference usually arises between the ground conductor layers. Such a potential difference usually induces an increase in transmission and reflection losses of a signal.

Particularly, in a multilayer circuit according to the present invention in which one input signal is distributed into two output signals, a plurality of ground conductor layers are inevitably needed. Further, the two output signals are desirably equal in terms of transmission and reflection losses.

In the present embodiment, the through holes 46 are provided between the first ground conductor layer 16 and the second ground conductor layer 18. Consequently, common grounding of shortest distance can be established in the vicinity of the signal lines, thereby minimizing a potential difference between the first ground conductor layer 16 and the second ground conductor layer 18. As a result, the transmission and reflection losses of signals output from the respective output signal lines 14 can be made equal to each other, and, by extension, there can be produced a high-frequency circuit device having a superior electric characteristic.

Alternatively, in lieu of the through holes 46, an metal-lized layer may be formed on the side surface of a multilayer circuit, or side through holes may be formed in place of the through holes 46.

The present embodiment illustrates a signal distribution circuit analogous to that described in connection with the first embodiment. In a case where the through holes 46 are formed in the signal composition circuit described in the second embodiment, there is yielded the same advantage as that yielded in the present embodiment.

Fifth Embodiment

The present embodiment relates to a signal distribution circuit in which one input transmission line and two output transmission lines are stacked into layers and a signal is distributed through electromagnetic coupling via openings. In the signal distribution circuit according to the present embodiment, a third dielectric layer is provided so as to cover one of the two output transmission lines. A third ground conductor layer having a slot opposite the output transmission line is provided on the surface of the third dielectric layer. A third conductor is provided between a fourth dielectric layer covering the third ground conductor layer, and the slot of the third ground conductor layer. The third conductor is connected to a terminating resistor.

Figure 9:
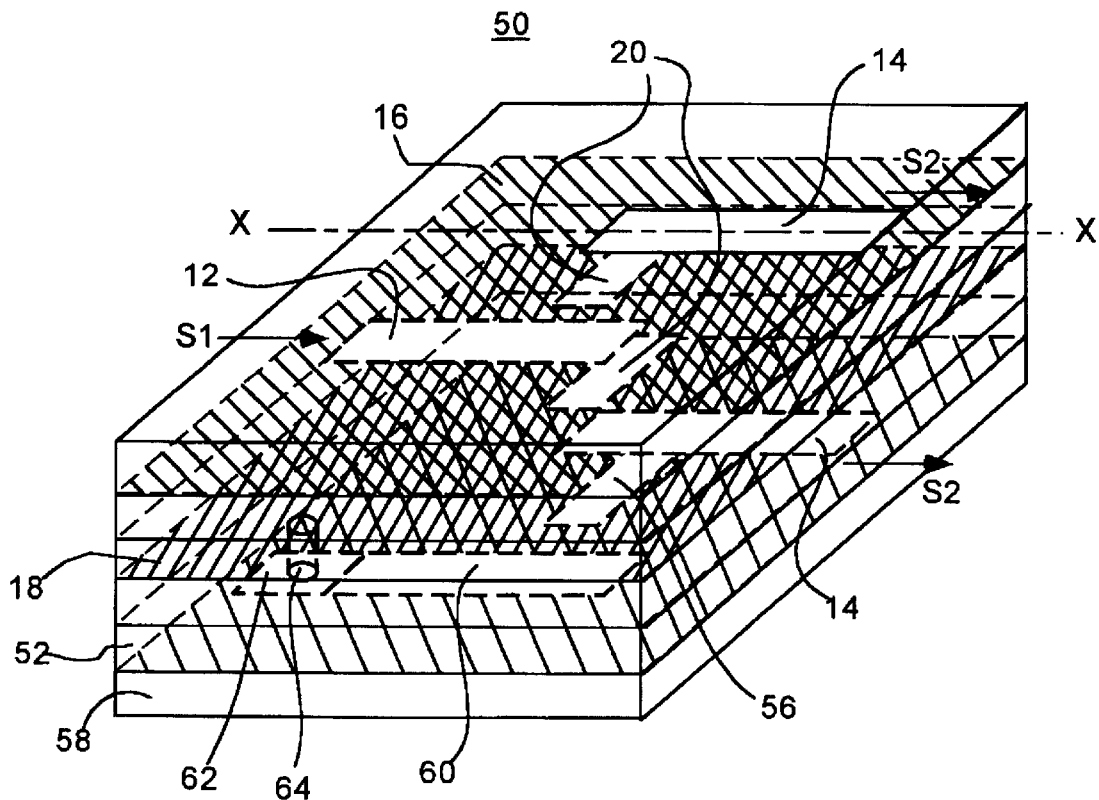
FIG. 9 is a perspective view showing a multi-layer circuit of a high-frequency circuit device according to a fifth embodiment.
Figure 10:
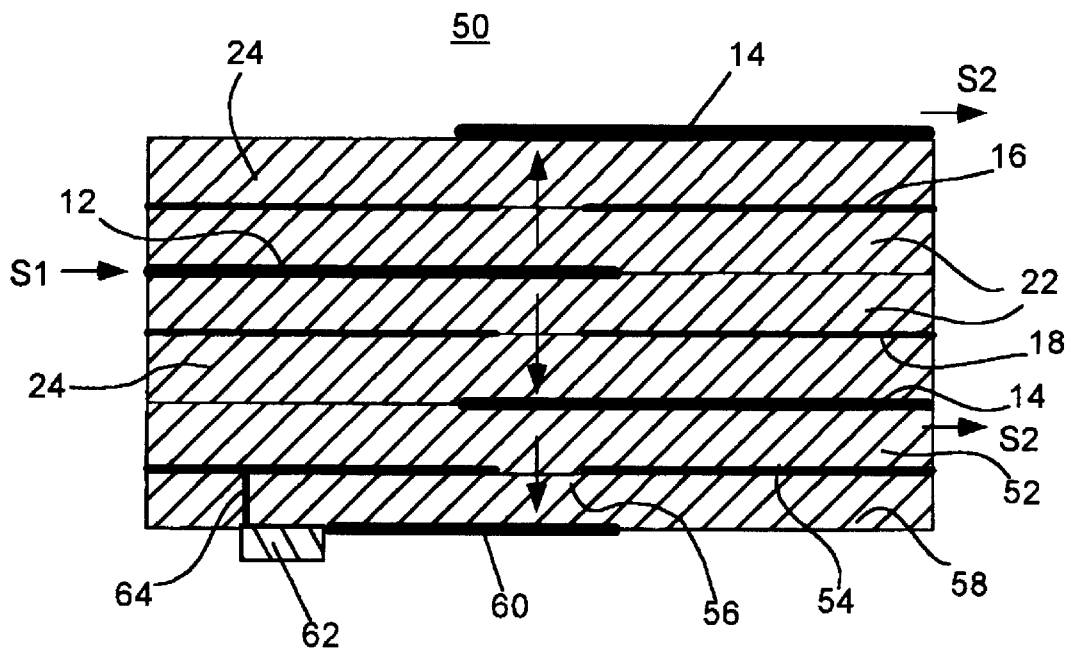
FIG. 10 is a cross-sectional view taken along line X—X shown in FIG. 9.

FIG. 9 is a perspective view showing a multilayer circuit of a high-frequency circuit device according to a fifth embodiment. FIG. 10 is a cross-sectional view taken along line X—X shown in FIG. 9.

In FIG. 9, reference numeral 50 designates a signal distribution circuit, which serves as a multilayer circuit constituting a portion of the high-frequency circuit device. The signal distribution circuit 50 is connected to a semiconductor element (not shown) or any of various circuit elements (not shown). Reference numeral 52 designates a third dielectric layer, which is laid so as to cover one of the output signal lines 14. Reference numeral 54 designates a third ground conductor layer laid over substantially the entire surface of the third dielectric layer 52. Reference numeral 56 designates a slot, which serves as a third opening and is provided opposite the output signal line 14 and in the third ground conductor layer 54.

Reference numeral 58 designates a fourth dielectric layer provided so as to cover the surface of the third grounding conductor layer 54. The third dielectric layer 52 and the fourth dielectric layer 58 are equal in thickness to and formed from the same materials as the first and second dielectric single layers 22 and 24.

Reference numeral 60 designates a connection signal line laid on the surface of the fourth dielectric layer 58. The connection signal line 60 is of the same size and formed from the same material as the input signal line 12 or the output signal line 14. Reference numeral 62 designates a terminating resistor connected to one end of the connection signal line 60. The terminating resistor 62 is connected to the third ground conductor layer 54 by way of a through hole 64. The resistance of the terminating resistor 62 is usually equal to the characteristic impedance of a signal line. In many cases, the terminating resistor 62 assumes a resistance value of 50Ω.

In FIGS. 9 and 10, those reference numerals that are the same as those shown in FIGS. 1 and 2 designate the same or corresponding elements.

In the present embodiment, the input signal line 12, the connection signal line 60, and the pair of output signal lines 14 are coupled together by way of three ground conductor layers (that is, the first ground conductor layer 16, the second ground conductor layer 18, and the third ground conductor layer 54). More specifically, the input signal line 12 and one of the output signal lines 14 are coupled, to thereby constitute an electromagnetic coupling conversion section by way of the slot 20. Further, the other output signal line 14 and the connection signal line 60 are coupled, to thereby constitute another electromagnetic coupling conversion section by way of the slot 56. These electromagnetic coupling conversion sections are arranged symmetrically with respect to the direction in which a signal is transmitted.

The above-described circuit configuration has two inputs and two outputs and does not act as a signal distribution circuit. Therefore, one of the two input lines is terminated to the terminating resistor 62, to thereby embody a signal distribution circuit having one input line and two output lines. In a case where the electromagnetic coupling conversion sections are arranged symmetrically, as mentioned above, impedance mismatch will not occur even if the slots 56 are equal in size with those of ordinary electromagnetic coupling conversion sections. Thus, the present embodiment facilitates construction of an electromagnetic coupling conversion section.

Sixth Embodiment

The present embodiment relates to a signal composition circuit in which two input transmission lines and one input transmission line are stacked into layers three-dimensionally. An embedded semiconductor element; for example, a mixer, is connected to one end of the output transmission line. Signals are directly transmitted to the semiconductor element through electromagnetic coupling via an opening, and the semiconductor element merges two input signals into a single output signal.

Figure 11:
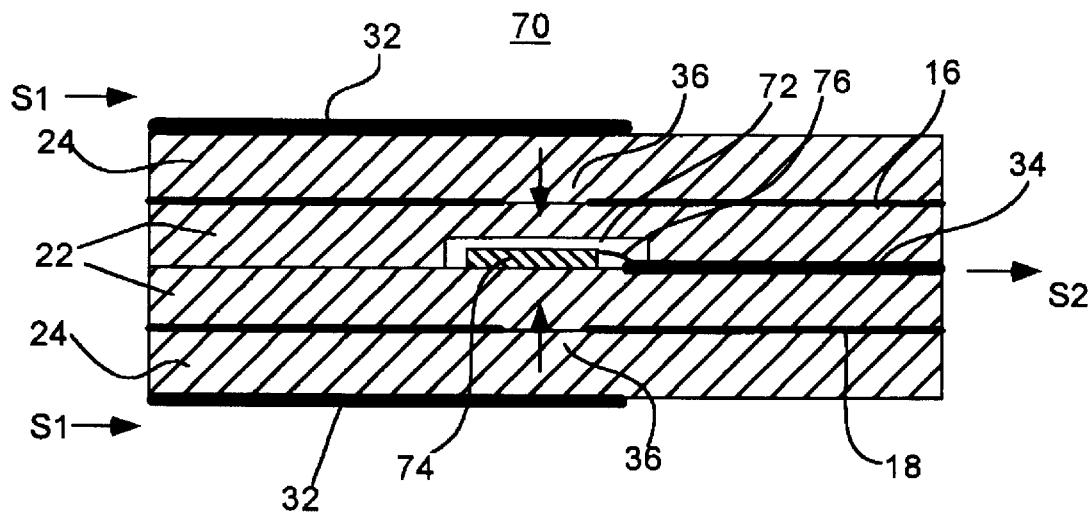
FIG. 11 is a cross-sectional view showing a multi-layer circuit of a high-frequency circuit device according to a sixth embodiment of the present invention.

FIG. 11 is a cross-sectional view showing a multilayer circuit of a high-frequency circuit device according to a sixth embodiment of the present invention.

In FIG. 11, reference numeral 70 designates a signal composition circuit, which serves as a multilayer circuit constituting a portion of the high-frequency circuit device. The signal composition circuit 70 is connected to another semiconductor element (not shown) or any of various circuit elements (not shown). Reference numeral 72 designates a cavity that is formed in the first dielectric layer 22 opposite a composition slot 36. Reference numeral 74 designates a semiconductor element, such as a mixer. A pole plate (not shown) serving as a terminal for receiving a signal is provided on the front and back of the mixer.

The semiconductor element 74 is formed in the cavity 72. Reference numeral 76 designates a bonding wire for connecting an output terminal (not shown) of the semiconductor element 74 to an output signal line 34.

In FIG. 11, those reference numerals that are the same as those shown in FIGS. 3 and 4 designate the same or corresponding elements.

In the present embodiment, the cavity 72 is formed in a signal composition section, and the semiconductor element 74 (mixer) is provided in the cavity 72 for converting the frequency of a signal.

In the case of receipt of a signal, an RF signal is input to one of the signal input transmission lines 32 as an input signal S1, and an LO signal is input to the other signal input transmission line 32 as an input signal line S1. The input signals are directly transmitted to the semiconductor chip 74 through electromagnetic coupling via the composition slot 36 and the pole plates of the semiconductor chip 74. The semiconductor chip 74 merges the input signals into an IF signal (f: |LO-RF|). The thus-merged signal is transmitted to the output signal line 34 by way of the bonding wire 72, and the resultant IF signal is transmitted to the outside as an output signal S2.

In the case of transmission of a signal, an IF signal is input to one of the signal input lines 32 as an input signal S1, and a LO signal is input to the other signal input line 32 as an input signal S1.

These input signals are transmitted to the semiconductor chip 74 by way of the composition slot 36, and the semiconductor chip 74 merges the input signals into an RF signal (f: |LO±RF|). The resultant RF signal is transmitted to the outside as an output signal S2.

Such a configuration enables direct introduction of a plurality of input signals into a semiconductor element and merging of the input signals into a single output signal. Thus, there can be constructed a circuit including a semiconductor element which is of simple structure and involves low loss; for example, a mixer circuit, and by extension, a compact, high-frequency circuit device having a superior electric characteristic can be produced.

In the present embodiment the cavity 72 is formed in the signal composition circuit, and a semiconductor element is hermetically encapsulated in the cavity 72. Alternatively, the semiconductor element may be sealed by means of molding.

The present embodiment has described the signal composition circuit as an example. Even in a case where the present invention is embodied as a signal distribution circuit, there is yielded the same advantage as that yielded in the present embodiment.

Seventh Embodiment

The present embodiment relates to a compact package comprising a signal distribution circuit, two semiconductor elements, and a signal composition circuit. In the signal distribution circuit, one input transmission line and two transmission lines are stacked into lines three-dimensionally, and an input signal is distributed through electromagnetic coupling via openings. The signals distributed by the signal distribution circuit are input to the respective semiconductor elements. In the signal composition circuit, two transmission lines connected to the respective semiconductor elements, and one output transmission line are stacked into layers three-dimensionally, and signals are merged into a single output signal through electromagnetic coupling via openings.

Figure 12:
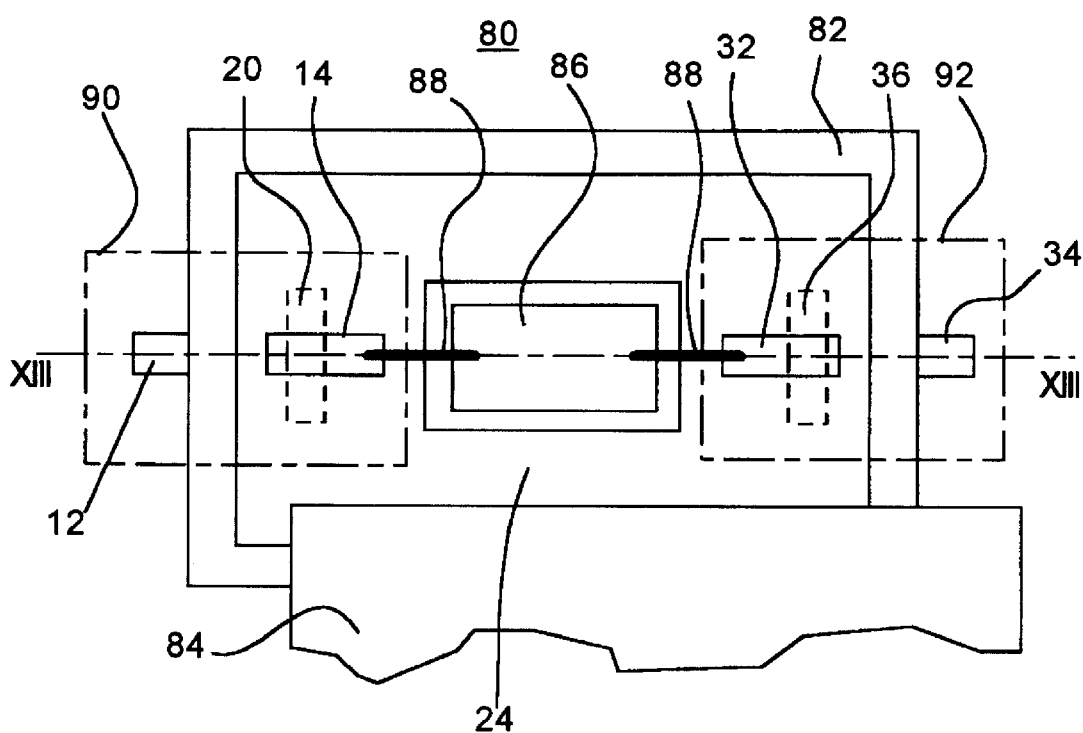
FIG. 12 is a plan view showing a high-frequency circuit device according to a seventh embodiment of the present invention.
Figure 13:
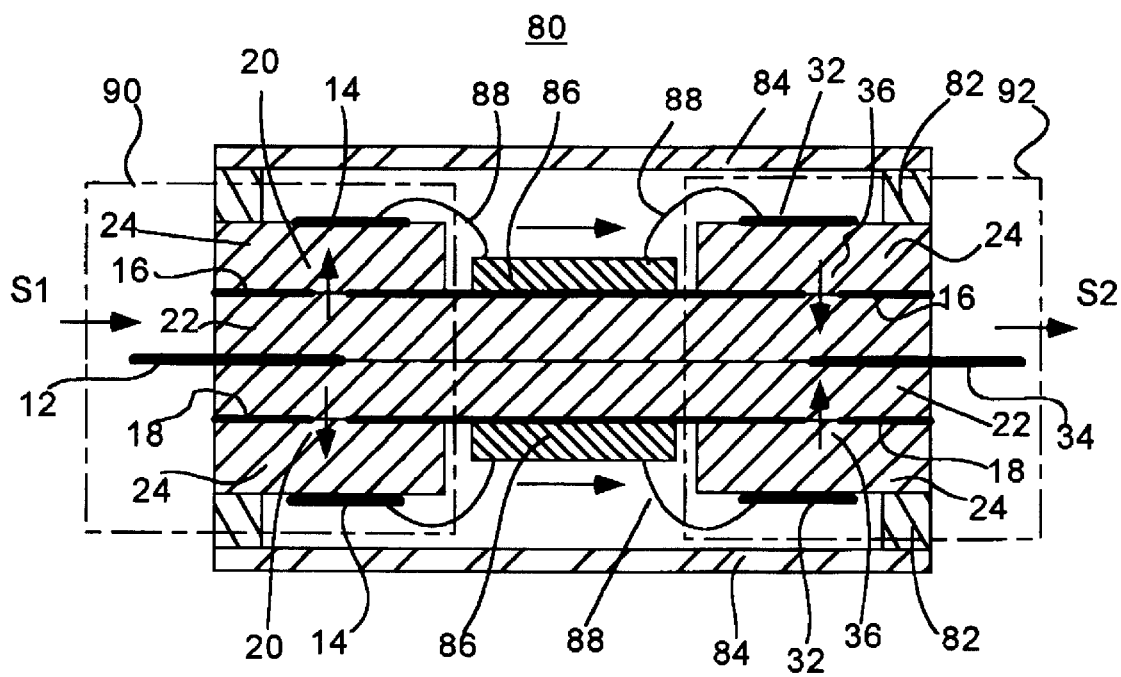
FIG. 13 is a cross-sectional view taken along line XIII—XIII shown in FIG. 12.

FIG. 12 is a plan view showing a high-frequency circuit device according to a seventh embodiment of the present invention. FIG. 13 is a cross-sectional view taken along line XIII—XIII shown in FIG. 12. The high-frequency circuit device will be described while taking an amplifier as an example.

In FIG. 12, reference numeral 80 designates a semiconductor package; 82 designates a wall of the package 80; 84 designates a cover which is provided on the wall 82 and seals the semiconductor package 80; 86 designates a semiconductor element; 88 designates a bonding wire; 90 designates a signal distribution circuit section serving as an input multilayer circuit; and 92 designates a signal composition circuit section serving as an output multilayer circuit.

The signal distribution circuit section 90 is identical in configuration with that described in connection with the first embodiment, and the signal composition circuit section 92 is identical in configuration with that described in connection with the second embodiment. Accordingly, the same reference numerals are used in FIG. 12.

The first dielectric layer, the second dielectric layer, and the first and second ground conductor layers are shared between the signal distribution circuit section 90 and the signal composition circuit section 92. Hence, those reference numerals that are the same as those used in the first embodiment are employed.

Further, the signal input lines and signal output lines are used in the first and second embodiments, signal input and output lines belonging to the signal distribution circuit section 90 are assigned the suffix-A, and signal input and output lines belonging to the signal composition circuit section 92 are assigned the suffix-B.

In the semiconductor package 80, a signal input line-A 12 serving as a first conductor and a signal output line-B 34 serving as a third conductor are sandwiched between the first dielectric layers 22. The signal input line-A 12 is taken as an input lead, and the signal output line-B 34 is taken as an output lead.

In FIG. 13, a first ground conductor layer 16 is laid on the first dielectric layer 22, and a second ground conductor layer 18 is laid on the underside of the first dielectric layer 22. A second dielectric layer 24 is laid on the surface of the first ground conductor layer 16 while a portion of the surface for placing a semiconductor element 86 remains uncovered. Similarly, a second dielectric layer 24 is laid on the underside of the second ground conductor layer 18 while a portion of the surface for placing a semiconductor element 86 remains uncovered. The semiconductor elements 86 are placed in respective uncovered portions on the first and second ground conductor layers 16 and 18. An input terminal (not shown) of the semiconductor element 86 is connected to the output signal line-A 14 serving as a second conductor, via a bonding wire 88, and an output terminal (not shown) of the semiconductor element 86 is connected to the input signal line-B 32 serving as a fourth conductor, via a bonding wire 88.

The wall members 82 are provided along the outer periphery of the top surface of the upper second dielectric layer 24 and that of the underside of the lower second dielectric layer 24. The cover 84 is provided on the wall member 82, thereby encapsulating therein the semiconductor element 86, the output signal line-A 14, and the input signal line-B 32. Although the wall members 82 and the covers 84 are formed from the same dielectric materials as are the first and second dielectric layers 22 and 24, the wall members 82 and the covers 84 may be formed from metal material.

In the semiconductor package 80, the wall members 82 are provided so as to surround the top and bottom surfaces of the second dielectric layers 24. If the first dielectric layers 22 have sufficient strength, the circumference of the second dielectric layers 24 may be removed, and the wall members 82 may be provided on the surfaces of the first dielectric layers 22.

In a case where the semiconductor package 80 corresponds to, for example, an amplifier, an external signal S1 is input to the signal input line-A 12 of the signal distribution circuit section 90. The input signal S1 transferred from the signal input line-A 12 is divided into the input signal S1 of the respective signal output lines-A 14 through electromagnetic coupling via input slots 20. The divided signals are amplified by the respective semiconductor elements 86, and the resultant signals are transmitted to the respective signal input lines-B 32 of the signal composition circuit 92. The signals are transferred from the signal input lines-B 32 and merged into a single signal through electromagnetic coupling via output slots 36. The resultant signal is delivered to the output signal line-B 34, from which the signal is output to the outside as an output signal S2.

In the semiconductor package 80 according to the present embodiment, one input signal line-A 12 and two-output signal lines-A 14 are stacked into layers three-dimensionally within the signal distribution circuit section 90. Further, two input signal lines-A 12 and one output signal line-A 14 are stacked into layers three-dimensionally within the signal composition circuit section 92. As a result, the semiconductor package 80 requires a smaller in-plane area. Further, semiconductor elements are stacked three-dimensionally, thereby enabling formation of a compact semiconductor package. As a result, a semiconductor package can be miniaturized to substantially half the size of a conventional semiconductor package.

Since a plurality of semiconductor elements are arranged three-dimensionally, a space required for packaging can be diminished. As a result, space resonance becomes less liable to arise. A semiconductor element is mounted in a cavity via a dielectric substance, thereby reducing leakage of a signal and improving an isolation characteristic.

In the present embodiment, input/output leads for receiving and outputting an external signal are not required assume a feed-through structure. Consequently, there can be reduced signal transmission losses that arise in the input/output leads. In the case of transmission in the range of extremely high frequencies, particularly, transmission of a signal of 50 GHz or more, signal transmission losses will abruptly increase because of strip lines in a feed-through structure. A high-frequency circuit device of configuration according to the present embodiment is effective for use in transmitting a signal of such an extremely high frequency.

In the present embodiment, a semiconductor element is directly mounted in an exposed portion of a ground conductor layer having slots formed therein. A surface on which a semiconductor element is to be mounted may differ from a ground conductor layer having slots formed therein.

Although in the present embodiment each of the input/output leads is formed from a single metal lead, each of the input/output leads may be formed from a metal lead having the shape of a coplanar line (i.e., a ground line-signal line-ground line). Alternatively, each of input/output leads may be embodied by means other than a metal lead, such as a TAB tape.

Eighth Embodiment

The present embodiment is equivalent to the seventh embodiment in which the input/output leads are modified. The input/output leads are formed from coplanar lines. The coplanar lines and the first dielectric layer, the first ground conductor layer, and the second dielectric layer, which are laid on the coplanar lines, are formed projectingly in the shape of eaves (see FIG. 15). The package can be mounted directly on the surface of a board by means of bringing the coplanar lines of the package into direct contact with coplanar lines routed on the board.

Figure 14:
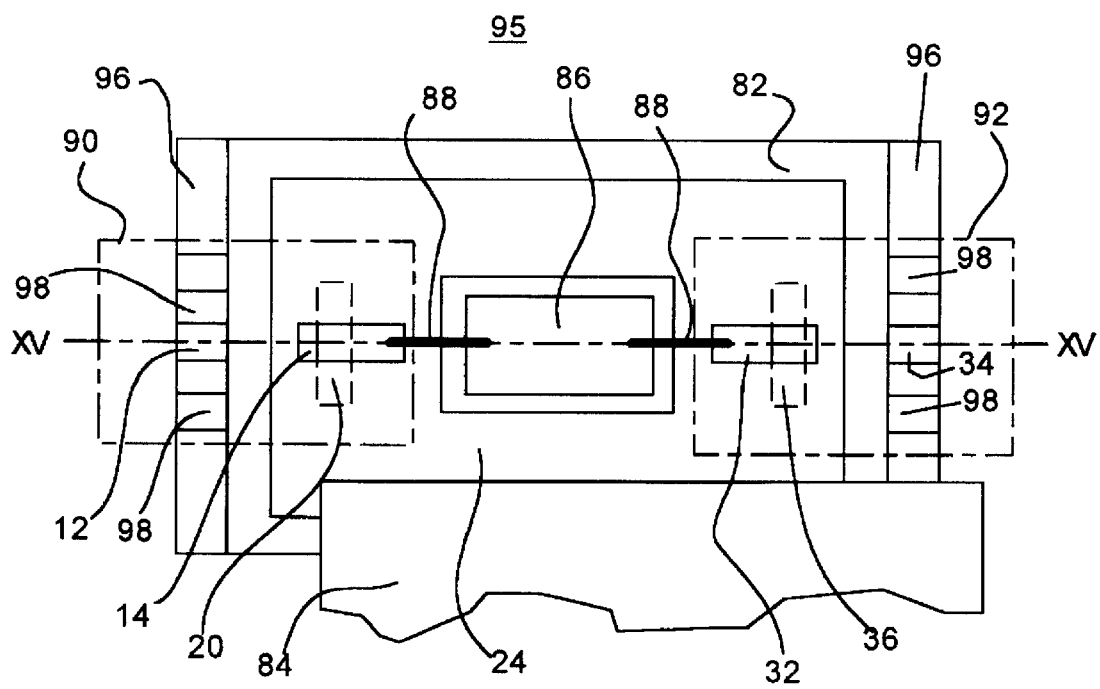
FIG. 14 is a plan view of a high-frequency circuit device according to the eighth embodiment when viewed from the bottom.
Figure 15:
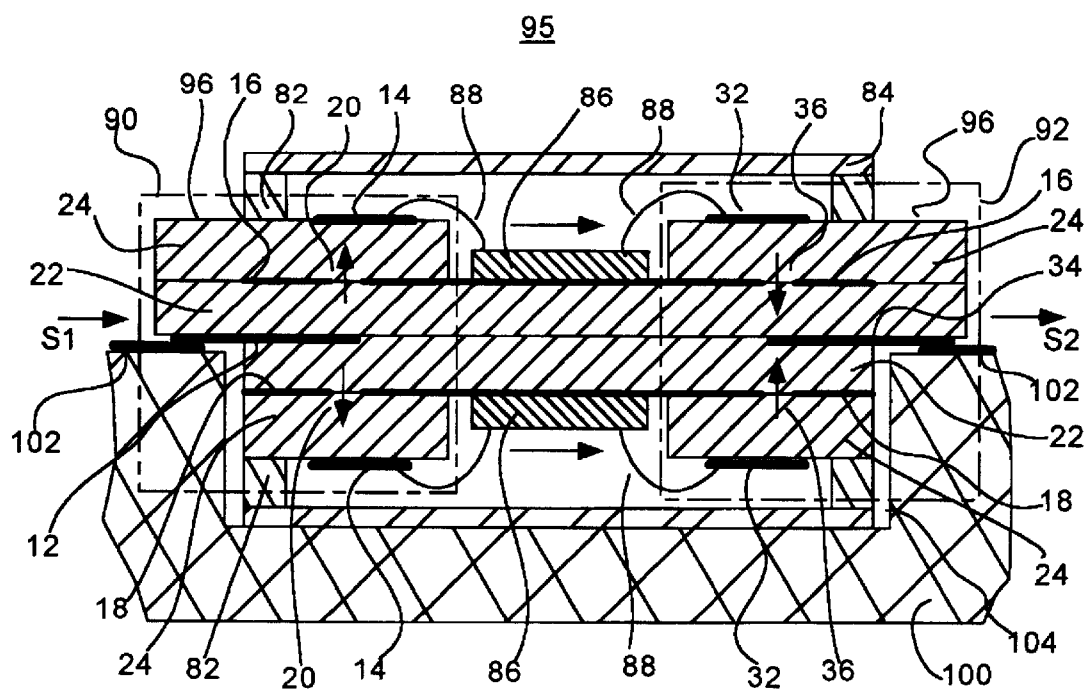
FIG. 15 is a cross-sectional view taken along line XV—XV shown in FIG. 14.

FIG. 14 is a plan view of a high-frequency, circuit device according to the eighth embodiment when viewed from the bottom, and FIG. 15 is a cross-sectional view taken along line XV—XV shown in FIG. 14.

In FIG. 14, reference numeral 95 designates a semiconductor package; and reference numeral 96 designates a seat of the semiconductor package 95. The seat is formed projectingly in the shape of overhang from the first dielectric layer 22, the second dielectric layer 24, and the first ground conductor layer 16.

Reference numeral 98 designates a ground line. The ground line 98 is provided on either side of and in parallel with the input signal line-A 12 extended to the surface of the seat 96, to thereby constitute a coplanar line. Similarly, the ground line 98 is provided on either side of and in parallel with the output signal line-B 34, to thereby constitute a coplanar line.

In FIG. 15, reference numeral 100 designates a board; and reference numeral 102 designates a signal line provided on the surface of the board 100. The ground line 98 is provided on either side of the signal line 102, to thereby constitute a coplanar line. Reference numeral 104 designates a cutout formed in the board 100.

In other respects, the semiconductor package according to the present embodiment is identical with that described in connection with the seventh embodiment. In FIGS. 14 and 15, those reference numerals that are the same as those shown in FIGS. 12 and 13 designate the same or corresponding elements.

The semiconductor package 95 is fitted into the cutout 104 of the board 100, and the seats 96 of the semiconductor package 95 are placed on the outer periphery of the cutout 104 of the board 100 such that the signal line 102 of the board 100 is brought into direct contact with the input signal line-A 12 of the semiconductor package 95 and such that the signal line 102 is brought into direct contact with the output signal line-B 34.

Since the seats 96 are formed in the semiconductor package 95, the semiconductor package 95 can be mounted on a board and can be readily packaged.

In the semiconductor package 95, since input/output leads for receiving and outputting an external signal are not required to assume a feed-through structure, there can be reduced signal transmission losses which arise in the input/output leads. By means of the seats 96, the signal line of the board 100 can be brought into direct contact with the input signal line-A 12 and the output signal line-B 34 of the semiconductor package 95. Transmission or reflection losses that arise in connections can be reduced much further, thereby preventing deterioration of a signal that arises in a connection.

Although a coplanar line is provided in the seat 96 of the semiconductor package 95, the first ground conductor layer 16 may be extended to the input signal line-A 12 and the output signal line-B 34 on the seats 96, to thereby constitute microstrip lines through use of signal lines provided on a board. Thus, input/output connections may be formed in the shape of microstrip lines.

Ninth Embodiment

The present embodiment relates to a semiconductor module into which the semiconductor package described in connection with the seventh or eighth embodiment is extended further. Here, the expression "module" signifies substantially a cluster of circuit elements; for example, a comparatively-large element in which are encapsulated a plurality of MMIC chips for effecting a plurality of functions, as well as capacitors, resistors, and other electronic components.

Figure 16:
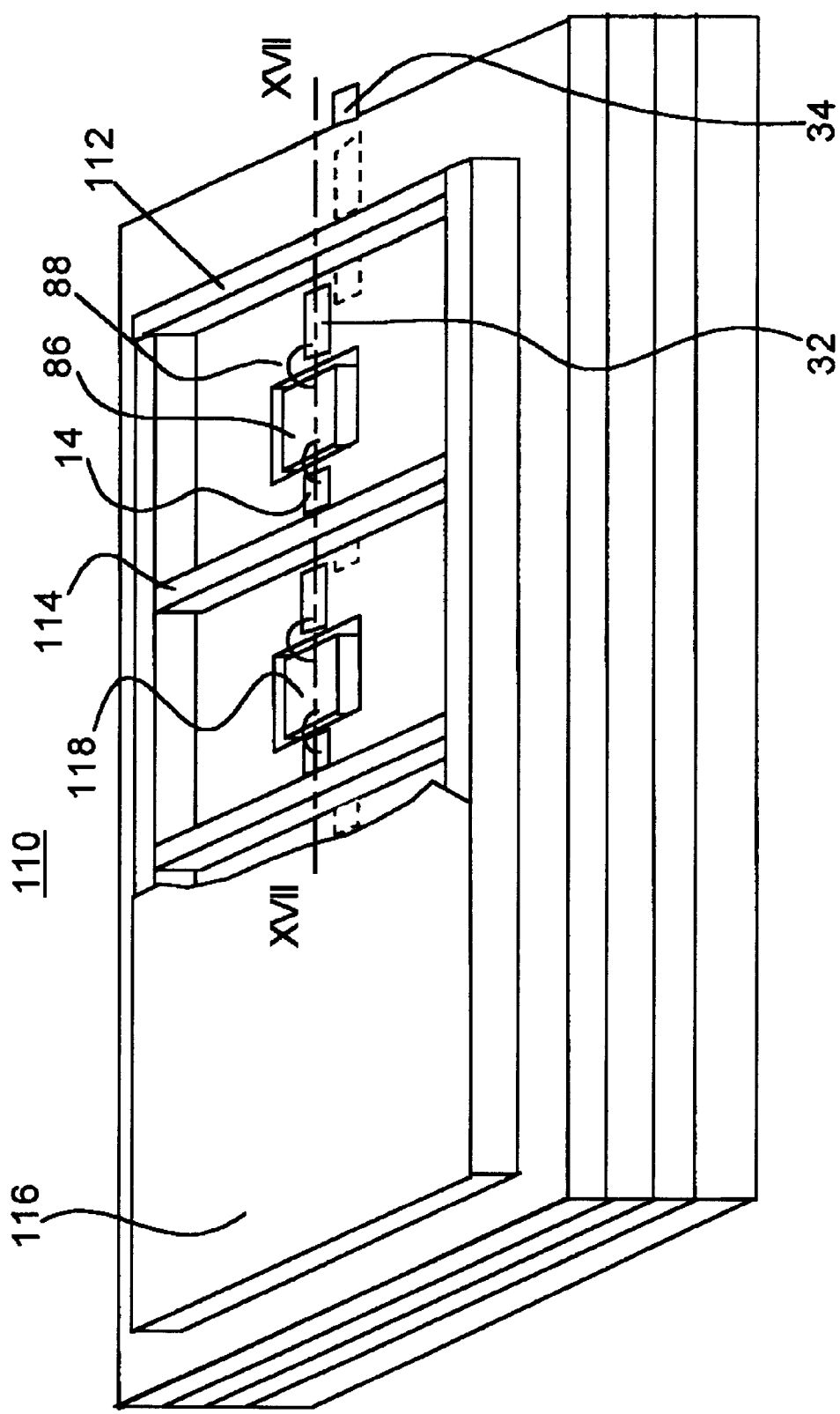
FIG. 16 is a fragmentary perspective view showing a high-frequency circuit device according to a ninth embodiment of the present invention.
Figure 17:
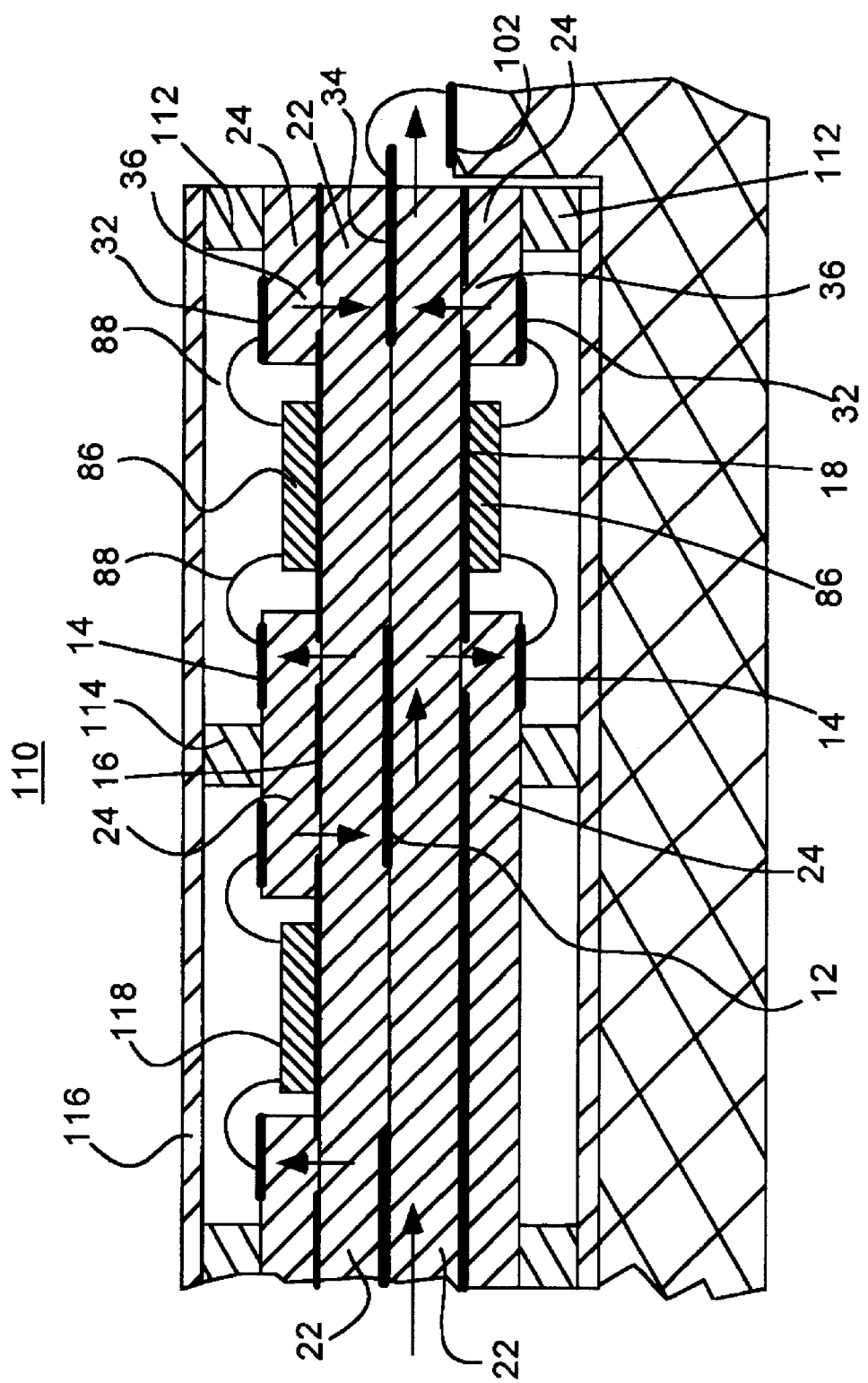
FIG. 17 is a cross-sectional view taken along line XVII—XVII shown in FIG. 16.
Figure 18:
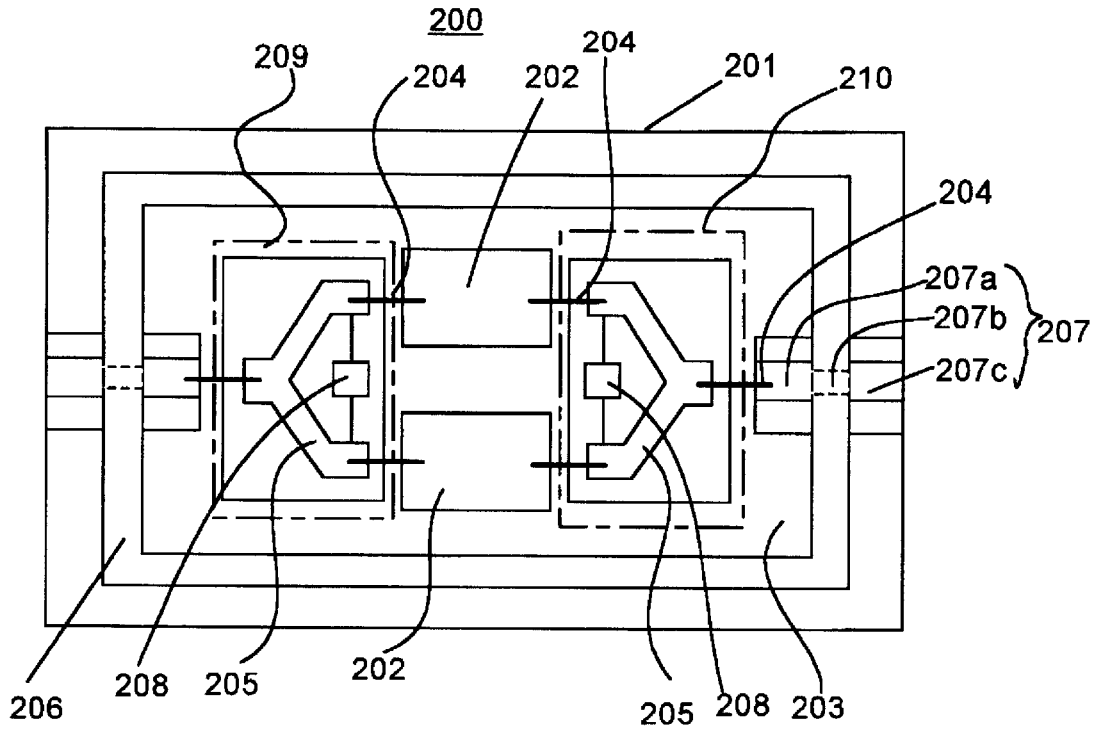
FIG. 18 is a plan view showing a conventional high-frequency semiconductor package.
Figure 19:
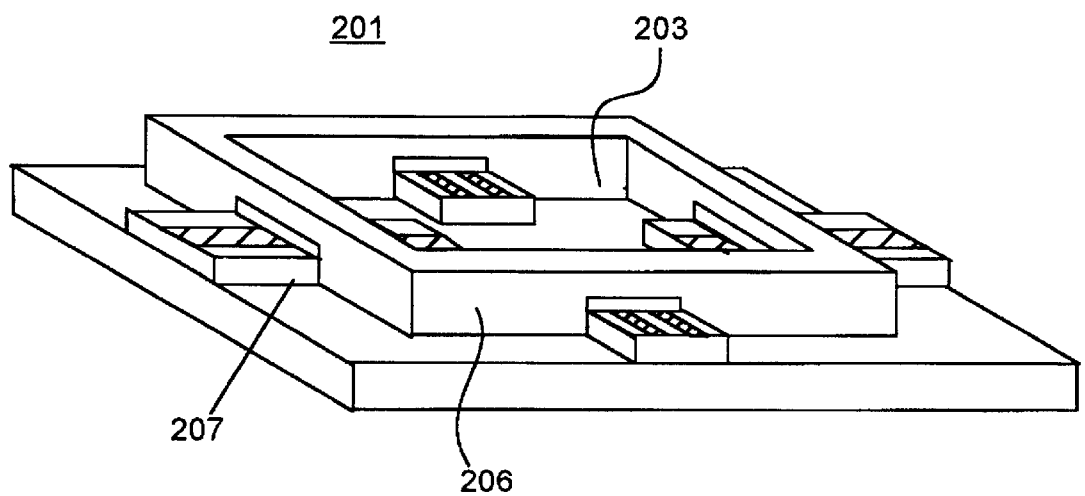
FIG. 19 is a perspective view showing the package housing of the conventional high-frequency circuit device.

FIG. 16 is a fragmentary perspective view showing a high-frequency circuit device according to a ninth embodiment of the present invention. FIG. 17 is a cross-sectional view taken along line XVII—XVII shown in FIG. 16. The high-frequency circuit device comprises, for example, a two-stage amplifying circuit.

In FIG. 16, reference numeral 110 designates a semiconductor module; 112 designates a wall member of the semiconductor module 110; 114 designates a partition provided between the wall members 112; and 116 designates a cover which is provided on the wall member 112, thus encapsulating a semiconductor element 85 and electronic components of circuit elements. Reference numeral 118 designates a semiconductor element for performing a first-stage amplifying operation. Reference numeral 86 designates a semiconductor element used in a second-stage amplifying circuit.

In FIGS. 16 and 17, those reference numerals that are the same as those shown in FIGS. 12 through 15 designate the same or corresponding elements.

In the present embodiment, the semiconductor module has a plurality of amplifying sections of a plurality of stages, and other electronic components (not shown) are provided in the cavities separated by partitions. A signal output from the semiconductor element 118 of a first-stage amplifying circuit section is transmitted to the input signal line A12 by means of electromagnetic coupling. The signal is then transmitted to a second-stage amplifying circuit section by passing by a position below the partition 114 by means of the input signal line A12. Thus, a signal passes by positions below many partitions by means of electromagnetic coupling.

As mentioned above, in the present embodiment, electromagnetic coupling is used for signal interface between a cavity and an external interface or between cavities. Further, so long as a multilayer circuit is used for a section of dividing a single signal into two signals or a section for merging two signals into a single signal, a semiconductor module can be made compact.

In the case of a feedthrough structure, there arise a transmission loss of 1 dB or more for 60 GHz and a transmission loss of 2 dB or more for 94 GHz. In the case of electromagnetic coupling, there arises a transmission loss of about 0.4 dB for 60 GHz or more. Even in a case where a semiconductor module employs an electromagnetic coupling structure, an internal signal line, and an electromagnetic coupling structure, the module is advantageous in structure over a feedthrough structure in terms of transmission loss, if the module is used for transmission of a signal having a frequency of 60 GHz or more. The greater is the frequency, the more advantageous is the module.

In the previous embodiments, signal transmission lines are employed as the first and second conductors for the sake of explanation. However, the first and second conductors may correspond to, for example, antennas.

The high-frequency circuit device according to the present invention has the forgoing configuration and yields the following advantages:

The present invention provides a high-frequency circuit device having a multilayer circuit, the multilayer circuit comprising: a first conductor for transmitting a signal; a first dielectric layer inserting the first conductor; a first ground conductor layer which is provided on one surface of the first dielectric layer and has a first opening; a second ground conductor layer which is provided on the other surface of the first dielectric layer and has another first opening, the openings of the first and second ground conductor layers being mutually opposed by way of the first dielectric layer; second dielectric layers, one being provided on the surface of the first ground conductor layer and the other being provided on the surface of the second ground conductor layer; and a pair of second conductors for transferring a signal, one being provided on the surface of one of the second dielectric layer and the other being provided on the surface of the other of the second dielectric layer, portions of the second conductors being mutually opposed via the first openings. By means of such a circuit configuration, a signal distribution circuit and a signal composition circuit are formed into a multilayer structure. Thus, the signal distribution circuit and the signal composition circuit can be made compact. As a result, there can be embodied a compact high-frequency circuit device.

Preferably, the first conductor and the second conductor pair are mutually opposed and partially overlap via the first openings. As a result, electromagnetic coupling between transmission lines is made effective, and transmission efficiency can be increased. Therefore, there can be embodied a high-frequency circuit device which involves low transmission loss.

Preferably, the high-frequency circuit device further comprises a semiconductor element electrically connected to the first conductor, and the semiconductor element is disposed opposite the second conductor pair via the first openings. As a result, a plurality of output signals can be extracted directly from the semiconductor, and a plurality of input signals can be transmitted directly to the semiconductor element. Consequently, there can be provided a compact, high frequency circuit device having a superior electrical characteristic.

Preferably, the first conductor of the multilayer circuit corresponds to an input signal line, and the second conductor corresponds to output signal lines. As a result, a signal distribution circuit can be made compact, and, by extension, there can be provided a compact high-frequency circuit device having a signal distribution circuit.

Preferably, the first conductor of the multilayer circuit corresponds to an output signal line, and the second conductor corresponds to input signal lines. As a result, a signal distribution circuit can be made compact, and, by extension, there can be provided a compact high-frequency circuit device having a signal composition circuit.

Preferably, the first and second ground conductor layers have second openings that are mutually opposed, and a resistor is disposed for interconnecting the second conductors by way of the second openings. By means of such a configuration, impedance matching and isolation of the second conductor can be improved, and, by extension, there can be produced a compact high-frequency circuit device having a superior electrical characteristic.

Preferably, there is provided a connection conductor for interconnecting the first and second ground conductor layers. By means of such a configuration, signal transmission and reflection losses can be diminished, and, by extension, there can be provided a compact, efficient high-frequency circuit device.

Preferably, each of the first openings assumes a rectangular shape; a shorter side of the first opening parallel with the longitudinal direction of the first or second conductor assumes a width which is less than 100% the width of the first or second conductor; and a longer side of the first opening which is orthogonal to the longitudinal direction of the first or second conductor assumes a width which is less than 300% the width of the first or second conductor. By means of such a configuration, impedance matching between the first and second conductors can be improved, and, by extension, there can be provided a compact high-frequency circuit device having a superior electrical characteristic.

Preferably, a third dielectric layer is laid on the surface of one of the second conductors; a third ground conductor layer having third openings, which openings are opposite the second conductor, is laid on the surface of the third dielectric layer; a fourth dielectric layer is provided on the surface of the third ground conductor layer; a connection signal line is provided on the fourth dielectric layer and opposite the second conductor by way of the third openings; and the connection signal line is connected to a terminating resistor. By means of such a configuration, the first conductor, the connection signal line, and the second conductor are arranged symmetrically with respect to the first and third openings. Therefore, realization of impedance matching is facilitated, and, by extension, the degree of freedom of design of the high-frequency circuit device is improved. Accordingly, there can be provided a compact high-frequency circuit device having a superior electrical characteristic.

The present invention also provides a high-frequency circuit device comprising: an input multi-layer circuit including a first conductor for transmitting an input signal, a first dielectric layer inserting the first conductor, a first ground conductor layer which is provided on one surface of the first dielectric layer and has an input opening, a second ground conductor layer which is provided on the other surface of the first dielectric layer and has another input opening, the input openings of the first and second ground conductor layers being mutually opposed through the first dielectric layer, second dielectric layers which are respectively provided on the surfaces of the first and second conductor layers so as to expose portions thereof, and a pair of second conductors for transmitting an input signal which are provided on the surfaces of the respective second dielectric layers, portions of the second conductors covering portions of the first conductor, and the second conductors being mutually opposed by way of the input openings; an output multi-layer circuit including, a third conductor for transmitting an output signal, the first dielectric layer inserting the third conductor, the first ground conductor layer which is provided on one surface of the first dielectric layer and has an output opening, the second ground conductor layer which is provided on the other surface of the first dielectric layer and has another output opening, the output openings of the first and second ground conductor layers being mutually opposed through the first dielectric layer, the second dielectric layers which are respectively provided on the surfaces of the first and second conductor layers, and a pair of fourth conductors for transmitting an output signal which are provided on the surfaces of the respective second dielectric layers, portions of the fourth conductors covering portions of the third conductor, and the fourth conductors being mutually opposed by way of the output openings; and semiconductor elements provided in respective exposed portions formed in the first and second ground conductor layers, one semiconductor element being connected to the second conductor and the fourth conductor on one side, and the other semiconductor element being connected to the second conductor and the fourth conductor on the other side. As a result, there can be embodied a compact high-frequency circuit device having a plurality of semiconductor elements, and distribution/composition circuits.

Preferably, a wall member is provided on the respective surface of the first dielectric layer so as to surround the semiconductor element, the second conductor, and the fourth conductor, the conductors being provided on the same side on which the semiconductor element is provided, and a cover is provided on the wall member. By means of such a configuration, space resonance and leakage of a signal can be diminished, which in turn enables production of a high-frequency circuit device having a superior electrical characteristic.

Preferably, the first conductor, the third conductor, and the first dielectric layer constitute an overhang projecting beyond the wall member, and a portion of the dielectric layer of the overhang is cut, to thereby expose the end of the first conductor and the end of the third conductor. By means of such a configuration, there can provided a high-frequency circuit device which involves low transmission loss arising in input/output lead sections and is easy to mount on a board.

While the presently preferred embodiments of the present invention have been shown and described, it is to be understood that these disclosures are for the purpose of illustration and that various changes and modifications may be made without departing from the scope of the invention as set forth in the appended claims.

The entire disclosure of a Japanese Patent Application No. 2000-171331, filed on Jun. 7, 2000 including specification, claims, drawings and summary, on which the Convention priority of the present application is based, are incorporated herein by reference in its entirety.

What is claimed is:

1. A high-frequency circuit device having a multilayer circuit, the multilayer circuit comprising:
   a first conductor for transmitting a signal, the first conductor having a length along a longitudinal direction and a width transverse to the longitudinal direction;
   first dielectric layer inserting said first conductor is embedded;
   a first ground conductor layer located on a first surface of said first dielectric layer and having a first opening;
   a second ground conductor layer on a second surface of said first dielectric layer and having a second opening, the first and second openings of said first and second ground conductor layers being mutually opposite each other on the first and second surfaces of said first dielectric layer;
   two second dielectric layers, a first of said second dielectric layers being located on a surface of said first ground conductor layer and a second of said second dielectric layers being located on a surface of said second ground conductor layer; and
   a pair of second conductors for transferring the signal transmitted in the first conductor, a first of said second conductors having a longitudinal direction substantially parallel to the longitudinal direction of the first conductor and a width, and being located on a surface of the first of said second dielectric layers, and a second of said second conductors having a longitudinal direction substantially parallel to the longitudinal direction of the first conductor and a width, and being located on a surface of the second of said second dielectric layers, portions of said second conductors being mutually opposed at the first and second openings, wherein the first and second openings have respective rectangular shapes with longer and shorter sides, the shorter sides being parallel to the longitudinal direction of the first conductor and shorter than the widths of each of the first and second conductors, and the longer sides are not more than three times longer than the widths of each of the first and second conductors.

2. The high-frequency circuit device according to claim 1, wherein the first conductor and the second conductors are mutually opposed and partially overlap at the first and second openings.

3. The high-frequency circuit device defined in claim 2, wherein the first conductor of the multilayer circuit corresponds to an input signal line, and the second conductors correspond to output signal lines.

4. The high-frequency circuit device defined in claim 2, wherein the first conductor of the multilayer circuit corresponds to an output signal line, and the second conductors correspond to input signal lines.

5. The high-frequency circuit device defined in claim 2, wherein the first and second ground conductor layers have respective third and fourth openings which are mutually opposed, and including a resistor interconnecting the pair of the second conductors and disposed in the third and fourth openings.

6. The high-frequency circuit device according to claim 2, further comprising a connection conductor interconnecting the first and second ground conductor layers.

7. The high-frequency circuit device according to claim 2, further comprising a third dielectric layer on a surface of one of the pair of second conductors, a third ground conductor layer having third openings opposite the second conductor, disposed on a surface of the third dielectric layer, a fourth dielectric layer located on a surface of the third ground conductor layer, a connection signal line located on the fourth dielectric layer and opposite one of the pair of second conductors at the third opening, and a terminating resistor connected to the connection signal line.

8. The high-frequency circuit device according to claim 1, further comprising a semiconductor element electrically connected to the first conductor, the semiconductor element being disposed opposite the second conductors at the first and second openings.

9. The high-frequency circuit device defined in claim 8, wherein the first conductor of the multilayer circuit corresponds to an output signal line, and the second conductors correspond to input signal lines.

10. The high-frequency circuit device defined in claim 8, wherein the first conductor of the multilayer circuit corresponds to an input signal line, and the second conductors correspond to output signal lines.

11. The high-frequency circuit device defined in claim 1, wherein the first conductor of the multilayer circuit corresponds to an input signal line, and the second conductors correspond to output signal lines.

12. The high-frequency circuit device defined in claim 1, wherein the first conductor of the multilayer circuit corresponds to an output signal line, and the second conductors correspond to input signal lines.

13. The high-frequency circuit device defined in claim 1, wherein the first and second ground conductor layers have respective third and fourth openings which are mutually opposed, and including a resistor interconnecting the pair of the second conductors and disposed in the third and fourth openings.

14. The high-frequency circuit device according to claim 1, further comprising a connection conductor interconnecting the first and second ground conductor layers.

15. The high-frequency circuit device according to claim 1, further comprising a third dielectric layer on a surface of one of the pair of second conductors, a third ground conductor layer having third openings opposite the second conductor, disposed on a surface of the third dielectric layer, a fourth dielectric layer located on a surface of the third ground conductor layer, a connection signal line located on the fourth dielectric layer and opposite one of the pair of second conductors at the third opening, and a terminating resistor connected to the connection signal line.

16. A high-frequency circuit device comprising:
an input multilayer circuit including,
a first conductor for transmitting an input signal,
a first dielectric layer in which said first conductor is embedded,
a first ground conductor layer located on a first surface of said first dielectric layer and having a first input opening,
a second ground conductor layer located on a second surface of said first dielectric layer and having a second opening, the first and second openings of said first and second ground conductor layers being mutually opposite each other on the first and second surfaces of said first dielectric layer,
two second dielectric layers respectively located on surfaces of said first and second ground conductor layer, leaving portions of said first and second conductors layers exposed, and
a pair of second conductors for transferring the input signal from the first conductor, each of said second conductors being located on a respective surface of one of said second dielectric layers, portions of said second conductors overlapping portions of said first conductor, and said second conductors being mutually opposed at the first and second input openings;
an output multilayer circuit including,
a third conductor for transmitting an output signal and embedded in said first dielectric layer, wherein
said first ground conductor layer has a first output opening,
said second ground conductor layer has a second output opening, the first and second output openings of said first and second ground conductor layers being mutually opposite each other on the first and second surfaces of said first dielectric layer, and
a pair of fourth conductors for transferring the output signal to the third conductor, each of said fourth conductors being located on a respective surface of one of said respective second dielectric layers, portions of said fourth conductors overlapping portions of said third conductor, said fourth conductors being mutually opposed at the output openings; and
first and second semiconductor elements located in respective exposed portions in said first and second ground conductor layers, said first semiconductor element being connected to said second conductor and said fourth conductor, and said second semiconductor element being connected to said second conductor and said fourth conductor.

17. The high-frequency circuit device according to claim 16, further comprising a wall member located on a surface of said first dielectric layer surrounding said first semiconductor element, said second conductor, and said fourth conductor, and a cover on said wall member.

18. The high-frequency circuit device according to claim 17, wherein said first conductor, said third conductor, and said first dielectric layer project beyond said wall member, and an end of said first conductor and an end of said third conductor are exposed in projecting beyond said wall member.

* * * * *